United States Patent
Du et al.

(10) Patent No.: US 10,270,146 B2
(45) Date of Patent: Apr. 23, 2019

(54) ULTRA WIDE BAND DIGITAL PHASE SHIFTER

(71) Applicant: NANJING MILEWEI CORP., Nanjing, Jiangsu (CN)

(72) Inventors: Jing Du, Jiangsu (CN); Le Jiang, Jiangsu (CN); Dong Xia, Jiangsu (CN)

(73) Assignee: NANJING MILEWEI CORP., Nanjing, Jiangsu (CN)

(*) Notice: Subject to any disclaimer, the term of this patent is extended or adjusted under 35 U.S.C. 154(b) by 126 days.

(21) Appl. No.: 15/512,224

(22) PCT Filed: Aug. 5, 2016

(86) PCT No.: PCT/CN2016/093393
§ 371 (c)(1),
(2) Date: Mar. 17, 2017

(87) PCT Pub. No.: WO2017/080263
PCT Pub. Date: May 18, 2017

(65) Prior Publication Data
US 2017/0279174 A1    Sep. 28, 2017

(30) Foreign Application Priority Data
Nov. 13, 2015  (CN) .......................... 2015 1 0776692

(51) Int. Cl.
*H01P 1/18* (2006.01)
*H03H 7/19* (2006.01)
(Continued)

(52) U.S. Cl.
CPC ............... *H01P 1/184* (2013.01); *H01Q 3/38* (2013.01); *H03H 7/09* (2013.01); *H03H 7/185* (2013.01); *H03H 7/19* (2013.01)

(58) Field of Classification Search
CPC .......... H01P 1/184; H03H 7/19; H03H 7/185; H03H 7/09; H01Q 3/38
(Continued)

(56) References Cited

U.S. PATENT DOCUMENTS

| | | | |
|---|---|---|---|
| 2008/0186108 A1* | 8/2008 | Miya | H03H 11/16 333/139 |
| 2011/0291728 A1 | 12/2011 | Xing | |
| 2012/0194296 A1* | 8/2012 | Unlu | H01P 1/184 333/156 |

FOREIGN PATENT DOCUMENTS

| | | |
|---|---|---|
| CN | 1072807 | 6/1993 |
| CN | 102270977 | 12/2011 |

(Continued)

OTHER PUBLICATIONS

Machine English Translation of CN202839906 Published on Mar. 27, 2013.*

(Continued)

*Primary Examiner* — Rakesh B Patel
*Assistant Examiner* — Jorge L Salazar, Jr.
(74) *Attorney, Agent, or Firm* — Rankin, Hill & Clark LLP

(57) ABSTRACT

The present invention discloses an ultra wide band digital phase shifter, wherein the phase shifter includes a coupler, a first impedance network and a second impedance network. The coupler is cascaded by spiral inductor coupling units; each stage of spiral inductive coupling unit includes a first spiral inductor and a second spiral inductor coupled mutually; multistage cascade of the spiral inductor coupling units is implemented through the series connection of each stage of first spiral inductors and the series connection of each stage of second spiral inductors; and the coupling interval or microstrip band width of each stage of spiral inductor coupling unit in the coupler from the exterior to the interior (Continued)

decreases gradually. The impedance networks are implemented using LC circuits and switching elements, and the states of the impedance networks are switched by a switch, thus producing phase displacement; therefore, the impedance network is rational in structure and is easy to implement; the phase shifter has the advantages of compact structure, small area occupation and good wideband character and has larger advantages and application space in integrated chip applications.

9 Claims, 4 Drawing Sheets

(51) Int. Cl.
*H01Q 3/38* (2006.01)
*H03H 7/09* (2006.01)
*H03H 7/18* (2006.01)

(58) Field of Classification Search
USPC .......................... 333/138, 139, 168, 169, 170
See application file for complete search history.

(56) References Cited

FOREIGN PATENT DOCUMENTS

| CN | 202839906 | 3/2013 |
| CN | 105280991 | 1/2016 |
| CN | 205122733 | 3/2016 |

OTHER PUBLICATIONS

International Search Report filed in PCT/CN2016/093393 dated Oct. 27, 2016.

* cited by examiner

ULTRA WIDE BAND DIGITAL PHASE SHIFTER

TECHNICAL FIELD

The present invention relates to a phase shifter, and more particularly, to a digital phase shifter.

BACKGROUND

With the continuous development of broadband active phased array radars, the demand for antenna beam control has been increasing, and the research on control circuit has been deepened.

As a key device for beam control, a phase shifter is always one of the key devices in an antenna transceiver module because of its many working states and technical features, large area occupation, high performance requirements, and high difficulty in design and manufacture. The development of the phased array radar has raised higher requirements on the bandwidth, phase-shifting accuracy and integrated area of the phase shifter, and other aspects. Therefore, it has great significance and practical value in researching broadband and ultra wide band high-performance phase shifters.

A reflective phase shifter is widely used in designing wideband phase shifters, wherein a traditional 3 dB coupler such as Lange coupler is larger in area, which is not beneficial for integration, and also increases the circuit cost. It is very difficult for a traditional reflective circuit to meet the band requirements of ultra wide band.

Therefore, it is very necessary to develop a compact ultra wide band digital phase shifter which can widen the bandwidth and reduce the circuit area.

SUMMARY

Object of the Present Invention in order to solve the defects in the related art, the patent provides an ultra wide band digital phase shifter.

Technical Solutions in order to solve the foregoing technical problems, the present invention provides an ultra wide band digital phase shifter which includes a coupler, a first impedance network and a second impedance network.

The coupler is cascaded by spiral inductor coupling units; each stage of spiral inductive coupling unit includes a first spiral inductor and a second spiral inductor coupled mutually; multistage cascade of the spiral inductor coupling units is implemented through the series connection of each stage of first spiral inductor and the series connection of each stage of second spiral inductor.

One end of the first spiral inductor in the first stage of spiral inductor coupling unit cascaded in the coupler and located outside is an input end of the coupler, and also serves as an input end of the phase shifter, and one end of the second spiral inductor located outside is a coupling end of the coupler connected with the first impedance network; one end of the first spiral inductor in the last stage of spiral inductor coupling unit in the coupler and located outside is a transmitted port of the coupler connected with the second impedance network, one end of the second spiral inductor located outside is an isolation end of the coupler, and also serves as an output end of the phase shifter.

The coupling interval or microstrip band width of each spiral inductor coupling unit in the coupler from the exterior to the interior decreases gradually.

Preferably, the first impedance network and the second impedance network have the same structure; when a target phase shift is 180 degrees, each impedance network is a parallel structure end-connected with a corresponding connection end of the coupler, and one circuit in the parallel structure is connected with a first switch in series and grounded through the first inductor, and another circuit is connected with a second switch in series and grounded through a second capacitor. Further preferably, the working states of the first switch and the second switch in the first impedance network are the same, and the working states of the first switch and the second switch in the second impedance network are the same.

Preferably, the first impedance network and the second impedance network have the same structure; when a target phase shift is non-180 degrees, each impedance network is a second inductor end-connected with a corresponding connection end of the coupler and connected in series with a parallel structure, and one circuit in the parallel structure is connected with a first switch in series and grounded through the first inductor, and another circuit is connected with a second switch in series and grounded through a second capacitor. Further preferably, the working states of the first switch and the second switch in the first impedance network are contrary, and the working states of the first switch and the second switch in the second impedance network are contrary.

Preferably, the spiral inductor coupling units are mutually coupled by locating the first spiral inductor and the second spiral inductor at the same layer of metal and using marginal coupling, or the spiral inductor coupling units are mutually coupled by locating the first spiral inductor and the second spiral inductor at different layers of metals and using marginal coupling and upper-lower layer coupling.

Preferably, a bridging capacitor is bridged between ports of the first and second spiral inductors of each spiral inductor coupling unit located at the same side, and the two ends of the bridging capacitor are respectively grounded through a ground capacitor.

Preferably, a circuit structure of the coupler is in bilateral symmetry and longitudinal symmetry.

Preferably, all the elements in the phase shifter are lumped elements.

Advantageous Effects the ultra wide band digital phase shifter provided by the present invention has the following advantages.

1. The coupler cascaded by a plurality of spiral inductor coupling units has the advantages of compact structure, simple manufacture, big power capacity and low insertion loss, can implement wider working bandwidth when being compared with a traditional coupler, and has outstanding advantages on the bandwidth.

2. The impedance networks are implemented using LC circuits and switching elements, and the states of the impedance networks are switched by switches, thus producing phase displacement; therefore, the impedance network is rational in structure and is easy to implement; compared with a traditional impedance network, the impedance network can provide steady phase shift in an ultra wide band frequency range with fewer elements and switches; after the impedance networks are coupled with the coupler, more excellent wideband character of the phase shifter can be entirely implemented through optimizing the element values of each component.

3. Further, all the elements of the phase shifter provided by the present invention are lumped elements, which greatly reduce the circuit area while being compared with a traditional wideband reflective phase shifter; moreover, the phase shifter has the advantages of compact structure, small area and low cost; the coupler and the impedance networks are designed based on the ultra wide band demands, so that the bandwidth of the phase shifter can be expanded to quadruplicated frequency and above; therefore, the phase shifter has good wideband character, has larger advantages and application space in integrated chip applications, and can be widely applied to radio frequency/microwave/millimeter wave frequency band wireless communication systems.

Generally speaking, the ultra wide band digital phase shifter provided by the present invention has the advantages of compact structure and small area occupation, has excellent stationary wave character, smaller phase shift fluctuation and lower insertion loss in an ultra wide band frequency range, and can be preferably and widely applied in a wideband active phased array radar system as a beam control device.

DETAILED DESCRIPTION

The present invention will be further explained in details with reference to the embodiments and the accompanying drawings, but the following embodiments will not constitute to any limitation to the present invention.

Figure 1:
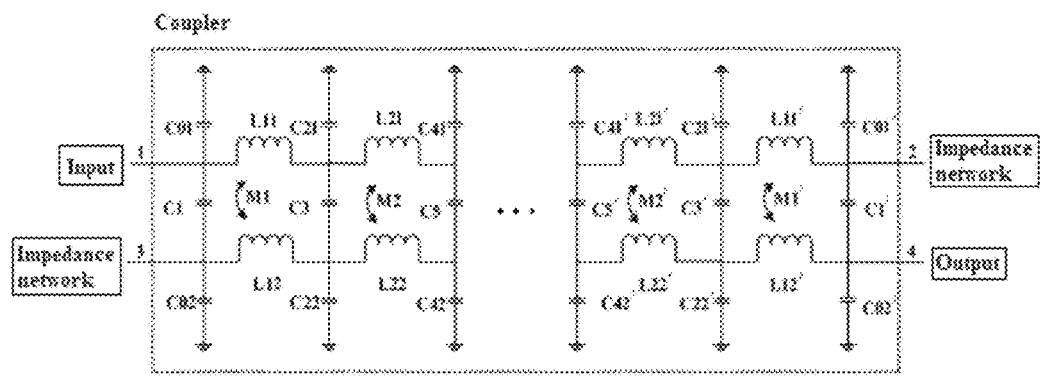
FIG. 1 is a structure block diagram of an ultra wide band digital phase shifter provided by the present invention.

An ultra wide band digital phase shifter provided by the embodiment of the present invention can implement wider working bandwidth using a smaller circuit area, and has excellent phase shift stability. As shown in FIG. 1, the ultra wide band digital phase shifter provided by the embodiment includes a coupler, a first impedance network and a second impedance network. The coupler includes an input end 1, a coupling end 3, transmitted port 2 and an isolation end 4, and is cascaded by one-stage or two-stage spiral inductor coupling units.

Figure 2:
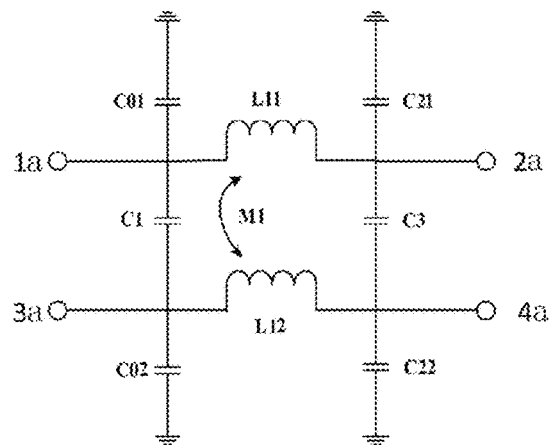
FIG. 2 is a circuit schematic diagram of a single-stage spiral inductor coupling units.

The spiral inductor coupling units have the same circuit structures, wherein the first stage of spiral inductor coupling unit is taken as an example to explain. The circuit schematic diagram of the first stage of spiral inductor coupling unit is as shown in FIG. 2, which includes a first spiral inductor L11 and a second spiral inductor L12 mutually coupled in this stage, a bridging capacitor C1 is bridged between the ports of the first and second spiral inductors located at the left side, a bridging capacitor C3 is bridged between the ports of the first and second spiral inductors located at the right side, the two ends of the bridging capacitor C1 are respectively grounded through ground capacitors C01 and C02, and the two ends of the bridging capacitor C3 are respectively grounded through ground capacitors C21 and C22. The two spiral inductors tightly coupled upper and down (i.e., the first and second spiral inductors L11 and L12) provide inductor marginal coupling, in the spiral inductor coupling units, mutual coupling is implemented by locating the first spiral inductor and the second spiral inductor on the same layer of metal and using marginal coupling, or mutual coupling is implemented by locating the first spiral inductor and the second spiral inductor on different layers of metals and using marginal coupling and upper-lower layer coupling. The four ground capacitors C01, C02, C21 and C22, and the bridging capacitors C1 and C3 between the two spiral inductors are used for providing proper odd and even mode impedance to implement a coupling function together. Ports 1a, 3a, 2a and 4a in the figures are an input end, a coupling end, transmitted port and an isolation end of each spiral inductor coupling unit respectively.

In the coupler, the input end 1a and the coupling end 3a of the first stage of spiral inductor coupling unit are respectively communicated with the input end 1 and the coupling end 3 of the coupler, and the transmitted port 2a and the isolation end 4a of the last stage of spiral inductor coupling unit are respectively communicated with the transmitted port 2 and the isolation end 4 of the coupler. That is, one end of the first spiral inductor in the first stage of spiral inductor coupling unit cascaded in the coupler and located outside is the input end of the coupler, and also serves as the input end of the phase shifter, and one end of the second spiral inductor located outside is the coupling end of the coupler connected with the first impedance network; one end of the first spiral inductor in the last stage of spiral inductor coupling unit in the coupler and located outside is the transmitted port of the coupler connected with the second impedance network, one end of the second spiral inductor located outside is the isolation end of the coupler, and also serves as the output end of the phase shifter.

Figure 3:
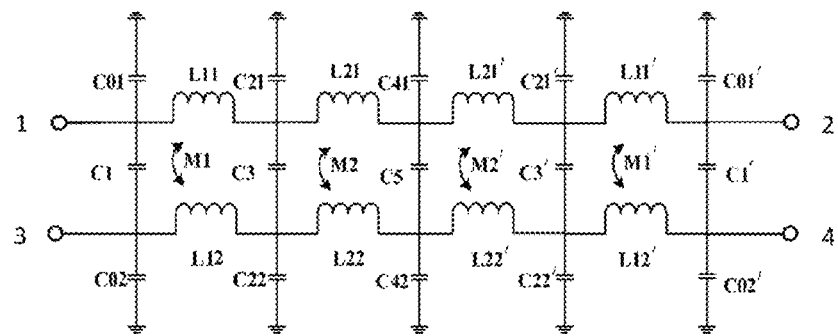
FIG. 3 is a circuit schematic diagram of a coupler cascaded by four stages of spiral inductor coupling units.

As shown in FIG. 1, multistage cascade of the spiral inductor coupling units is implemented through the series connection of each stage of first spiral inductor and the series connection of each stage of second spiral inductor. As shown in FIG. 3, an ultra wide band coupler formed by four spiral inductor coupling units is taken as an example herein to introduce the detailed descriptions thereof.

To expand the wideband, four spiral inductor coupling units are cascaded to form the series coupler as shown in FIG. 3. Ports 1, 2, 3 and 4 are respectively an input end, a transmitted port, a coupling end and an isolation end of the ultra wide band coupler, and respectively recorded as a first stage of spiral inductor coupling unit, a second stage of spiral inductor coupling unit, a third stage of spiral inductor coupling unit and a fourth stage of spiral inductor coupling unit in sequence from left to right, multistage cascade of the spiral inductor coupling units is implemented through the series connection of each stage of first spiral inductors and the series connection of each stage of second spiral inductors, and a bridging capacitor and ground capacitors located at the two ends of the bridging capacitor are shared by two adjacent stages. A circuit structure of the coupler is in bilateral symmetry and longitudinal symmetry, i.e.: the first stage of spiral inductor coupling unit, the second stage of spiral inductor coupling unit, the third stage of spiral inductor coupling unit and the fourth stage of spiral inductor coupling unit are symmetric to a horizontal central line and a vertical central line structurally, wherein in FIG. 3, C01=C02=C01'=C02', and C1=C1'; C21=C22=C21'=C22', and C3=C3'; C41=C42; L11=L12=L11'=L12'; L21=L22=L21'=L22'; M1, M2, M2' and M1' represent coupling factors of two spiral inductors tightly coupled in the first stage of spiral inductor coupling unit, the second stage of spiral inductor coupling unit, the third stage of spiral inductor coupling unit and the fourth stage of spiral inductor coupling unit respectively; due to the structural symmetry of the circuit, M1=M1', and M2=M2'. The function of the coupler in the entire phase shifter is to isolate input and output signals and reflect the phase shift of the impedance networks under two states.

Meanwhile, two spiral inductors mutually coupled in the two spiral inductor coupling units located outside in the example, i.e., the first stage of spiral inductor coupling unit and the fourth stage of spiral inductor coupling unit, have larger intervals and smaller coupling factors; however, the spiral inductors mutually coupled in the two spiral inductor coupling units relatively located in the center, i.e., the second stage of spiral inductor coupling unit and the third spiral inductor coupling unit have smaller intervals and larger coupling factors, and implement close coupling; therefore, M1=M1'<M2=M2'. According to the coupler structure, the coupling intervals of each spiral inductor coupling unit in the coupler from the exterior to the interior decreases gradually, which implements gradual change of the coupling factor from the exterior to the interior, thus implementing ultra wide band coupling of the coupler.

Certainly, the foregoing is only an example of the prevent invention. The ultra wide band coupler in the ultra wide band digital phase shifter provided by the present invention can be cascaded by multistage spiral inductor coupling units according to the actual requirements, for example, five stages, six stages, seven stages and even more; the coupling factors of each stage of spiral inductor coupling units can be changed gradually and adjustable from the exterior to the interior through the coupling intervals or microstrip band widths of two spiral inductors mutually coupled thereof. In the present invention, the coupling intervals or microstrip band widths of each spiral inductor coupling unit in the coupler from the exterior to the interior decreases gradually.

On the structure of the ultra wide band digital phase shifter provided by the present invention, the coupling intervals and capacitor's capacity of each spiral inductor coupling unit are optimized through electromagnetic simulation, so that an ultra wide working band required can be obtained; moreover, radio frequencies/microwave signal frequencies outputted by the transmitted port and the coupling end are the same as that of input signals, to implement 3 dB power equal dividing. On the aspect of phase, an output signal of the transmitted port and an output signal of the coupling end differ by 90 degrees, which implements a structure for transforming between a single-ended signal and an orthogonal signal.

The first impedance network and the second impedance network in the ultra wide band digital phase shifter have the same structures, which are respectively connected to the coupling end and the transmitted port of the coupler, and are implemented using LC circuits and switching elements. The same structure of the first and second impedance networks has the advantages that the reflective phase shift of the impedance networks can be reflected on the input and output ends of the phase shifter losslessly, so as to avoid the problem of amplitude loss and complicated phase synthesis calculation at the input and output ends of the phase shifter due to different amplitude phases of the two reflected signals. The impedance networks are implemented using LC circuits and switching elements, and the states of the impedance networks are switched by switches, thus producing phase displacement; therefore, the impedance network is rational in structure and is easy to implement; compared with a traditional impedance network, the impedance network can provide steady phase displacement in an ultra wide band frequency range with fewer elements and switches. After the impedance networks are coupled with the coupler, more excellent wideband character of the phase shifter can be entirely implemented through optimizing the element values of each component.

Figure 4:
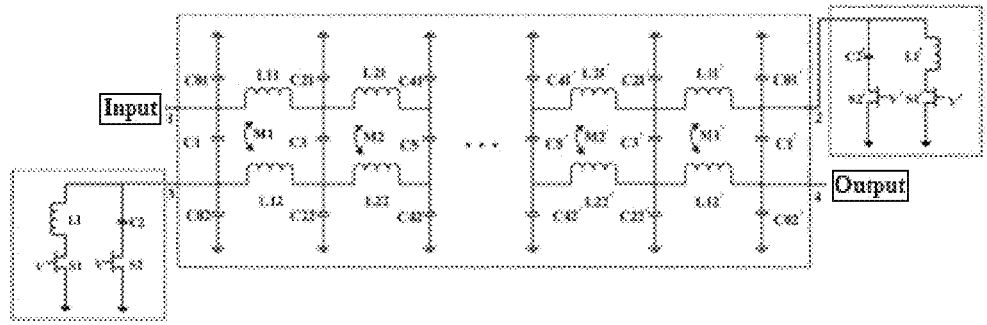
FIG. 4 is a circuit schematic diagram of a phase shifter when a target phase shift is 180 degrees.

When a target phase displacement is 180 degrees, each impedance network is a parallel structure end-connected with a corresponding connection end of the coupler, and one circuit in the parallel structure is connected with a first switch in series and grounded through the first inductor, and another circuit is connected with a second switch in series and grounded through a second capacitor. The structure of the phase shifter at this moment is as shown in FIG. 4. The first impedance network is a parallel structure end-connected with the coupling end of the coupler. One circuit in the parallel structure is connected with a first switch S1 in series and grounded through a first inductor L1, and another circuit is connected with a second switch S2 in series and grounded through a second capacitor C2. The second impedance network is a parallel structure end-connected with the transmitted port of the coupler. One circuit in the parallel structure is connected with a first switch S1' in series and grounded through a first inductor L1', and another circuit is connected with a second switch S2' in series and grounded through a second capacitor C2'. The first and second switches in the first and second impedance networks are "on" when a grid drive voltage V or V' is positive; at this moment, the switch can be equivalent to a small resistor Ron; and the switches are "on" when the grid drive voltage V or V' is negative; at this moment, the switch can be equivalent to a small capacitor Coff. The states of the impedance networks are switched by the switches, thus producing phase shift. Two switches are respectively used in each impedance network; in each impedance network, the working states of the two switches are the same, i.e., the working states of the first switch S1 and the second switch S2 in the first impedance network are the same, and the working states of the first switch S1' and the second switch S2' in the second impedance network are the same.

Figure 5:
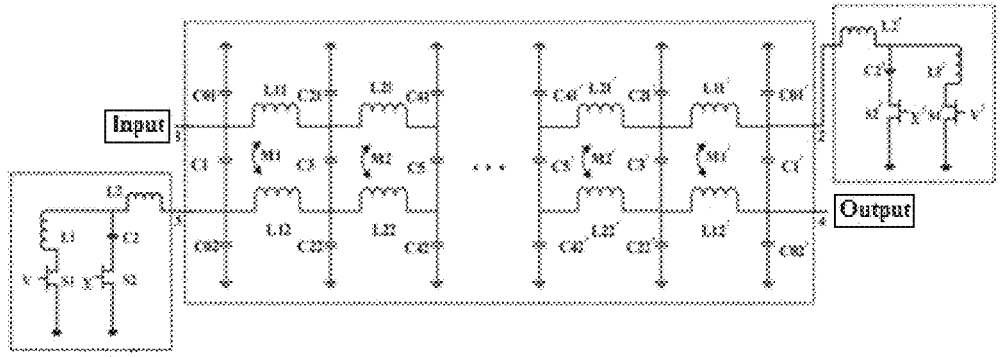
FIG. 5 is a circuit schematic diagram of a phase shifter when a target phase shift is non-180 degrees.

When a target phase displacement is non-180 degrees, each impedance network is a second inductor end-connected with a corresponding connection end of the coupler and connected in series with a parallel structure, and one circuit in the parallel structure is connected with a first switch in series and grounded through the first inductor, and another circuit is connected with a second switch in series and grounded through a second capacitor. The structure of the phase shifter at this moment is as shown in FIG. 5. The first impedance network is a second inductor L2 end-connected with the coupling end of the coupler and connected in series with a parallel structure. A second inductor L2 in the impedance network is connected in series with a parallel structure. One circuit in the parallel structure is connected with a first switch S1 in series and grounded through a first inductor L1, and another circuit is connected with a second switch S2 in series and grounded through a second capacitor C2. The second impedance network is end-connected with the transmitted port of the coupler. A second inductor L2' in the impedance network is connected in series with a parallel structure. One circuit in the parallel structure is connected with a first switch S1' in series and grounded through a first inductor L1', and another circuit is connected with a second switch S2' in series and grounded through a second capacitor C2'. The first and second switches in the first and second impedance networks are "on" when a grid drive voltage V or V' is positive; at this moment, the switch can be equivalent to a small resistor Ron; and the switches are "on" when the grid drive voltage V or V' is negative; at this moment, the switch can be equivalent to a small capacitor Coff. The states of the impedance networks are switched by the switches, thus producing phase shift. Two switches are respectively used in each impedance network; in each impedance network, the working states of the two switches are contrary, i.e., the working states of the first switch S1 and the second switch S2 in the first impedance network are contrary, and the working states of the first switch S1' and the second switch S2' in the second impedance network are contrary. In FIG. 5, $\underline{V}$ represents a state contrary to the working state V, and $\underline{V'}$ represents a state contrary to the working state V'.

The two different states of the switch determine the two working states of the phase shifter, which are a reference state and a phase shift state respectively. The impedance network is composed of an LC element and a switch. When the switch Ron is ignored, the impedance network can be equivalent to four unit structures: single inductor L, single capacitor C, series LC units and combination of parallel LC units. Different states of the switch enable the equivalent structures of the impedance network different, and the phase shift of the reflection factors of the impedance networks under the two states is namely the phase shift of the phase shifter.

The first impedance network with a target phase shift of 180 degrees is taken as an example, it is set as a reference state when the first switch S1 is on and the second switch S2 is on, and it is set as a phase shift state when the first switch S1 is off and the second switch S2 is off. Under the reference state, the switches S1 and S2 are equivalent to be Ron1 and Ron2, wherein Ron1 and Ron2 are very small and can be ignored, and the circuit of the impedance network is equivalent to that a second capacitor C2 is connected with a first inductor L1 in parallel; under the phase shift state, the switches S1 and S2 are equivalent to Coff1 and Coff2. A second capacitor C2 in a subcircuit of the switch S2 is connected in series with Coff2, and the equivalent capacitor of the subcircuit is smaller than Coff2, and can be ignored, and the circuit of the impedance network is equivalent to that the capacitor Coff1 is connected in series with the first inductor L1. The second impedance network and the first impedance network are completely the same; under the phase shift state and the reference state, the changes of the phase differences produced at the corresponding input and output ports of the phase shifter are reflected through the first and second impedance networks, i.e., the 180-degree phase shift of the phase shifter. Ron and Coff depend on the switch characters. The inductor values or capacitor values in the circuit can be set and optimized according to a specific target frequency band, for example, a quadruplicated frequency 4~16 GHz frequency band.

When the target phase shift is non-180 degrees, the first impedance network with a target phase shift of 90 degrees is taken as an example, it is set as a reference state when the first switch S1 is on and the second switch S2 is off, and it is set as a phase shift state when the first switch S1 is off and the second switch S2 is on. Under the reference state, the switches S1 and S2 are respectively equivalent to Ron1 and Coff2; the subcircuit Ron1 of the switch S1 can be ignored; in a subcircuit of the switch S2, a second capacitor C2 is connected in series with the Coff2, and the equivalent capacitor of the subcircuit is smaller than Coff2, and can be ignored. The circuit of the impedance network is equivalent to that a first inductor L1 is connected in series with a second inductor L2; under the phase shift state, the switches S1 and S2 are respectively equivalent to Coff1 and Ron2; when the target phase shift is 90 degrees, the first inductor L1 is far smaller than the second inductor L2, the first inductor L1 in the subcircuit of the switch S1 and Coff1 can be ignored, the subcircuit Ron2 of the switch S2 can be ignored, and the circuit of the impedance network is equivalent to that the second inductor L2 is connected in series with the second capacitor C2. The second impedance network and the first impedance network are completely the same; under the phase shift state and the reference state, the changes of the phase differences produced at the corresponding input and output ports of the phase shifter are reflected through the first and second impedance networks, i.e., the 90-degree phase shift of the phase shifter. Ron and Coff depend on the switch characters. The inductor values or capacitor values in the circuit can be set and optimized according to a specific target frequency band, for example, a quadruplicated frequency 4~16 GHz frequency band. Situations of phase shift with other degrees excluding 180 degrees are similar to that of 90 degrees, and the phase shift function of phase shift with other degrees excluding 180 degrees can be implemented according to the phase shift and specific frequency band by adjusting the values of the inductors and capacitors of the impedance network.

All the elements of the phase shifter provided by the foregoing embodiments in the present invention are lumped elements, which greatly reduce the circuit area while being compared with a traditional wideband reflective phase shifter, moreover, the phase shifter has the advantages of compact structure, small area and low cost; the coupler and the impedance networks are designed based on the ultra wide band demands, so that the bandwidth of the phase shifter can be expanded to quadruplicated frequency and above; therefore, the phase shifter has good wideband character, has larger advantages and application space in integrated chip applications, and can be widely applied to radio frequency/microwave/millimeter wave frequency band wireless communication systems.

Figure 6:
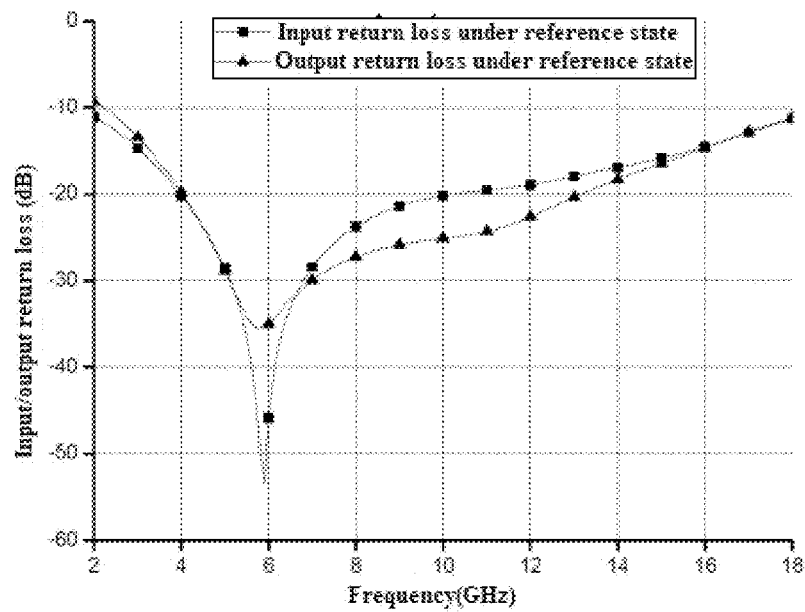
FIG. 6 is a diagram illustrating input and output return loss simulation results of a 4~16 GHz ultra wide band 90-degree digital phase shifter under a reference state.
Figure 7:
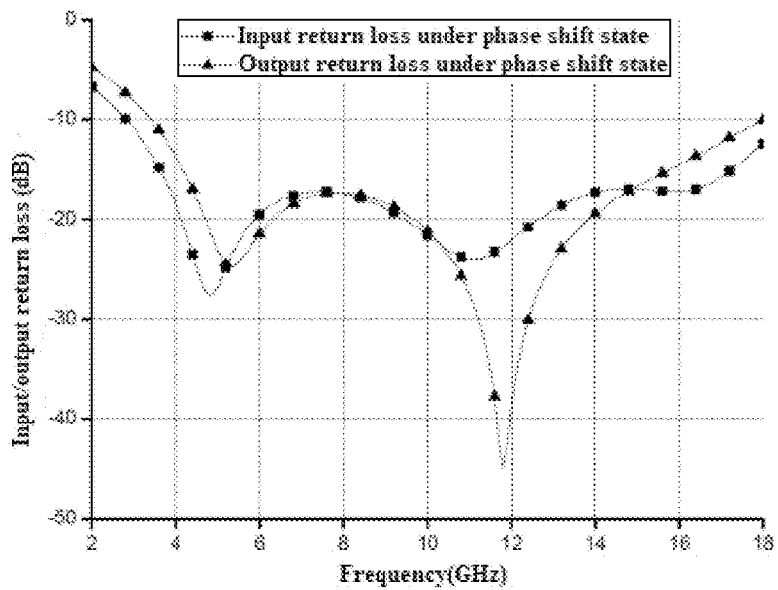
FIG. 7 is a diagram illustrating input and output return loss simulation results of the 4~16 GHz ultra wide band 90-degree digital phase shifter under a phase shift state.
Figure 8:
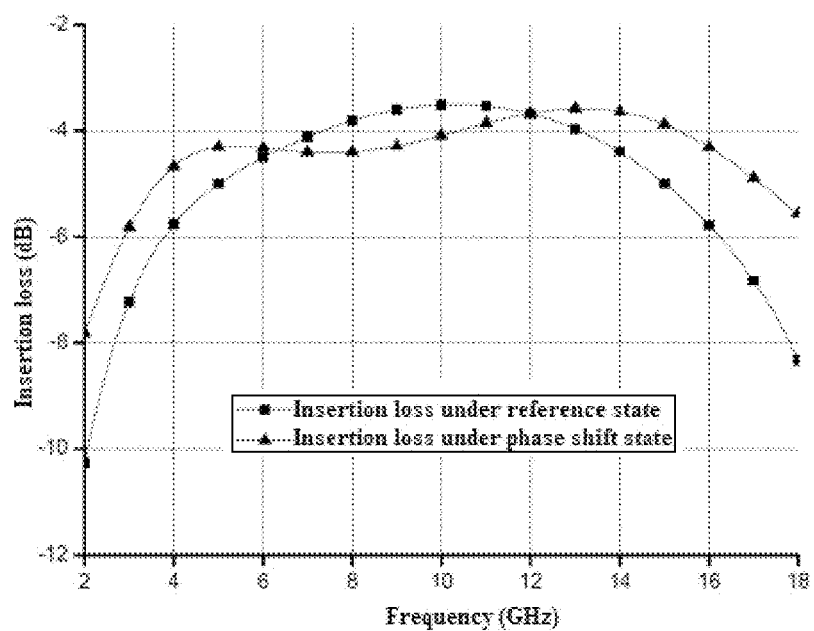
FIG. 8 is a diagram illustrating insertion loss simulation results of the 4~16 GHz ultra wide band 90-degree digital phase shifter under two states.
Figure 9:
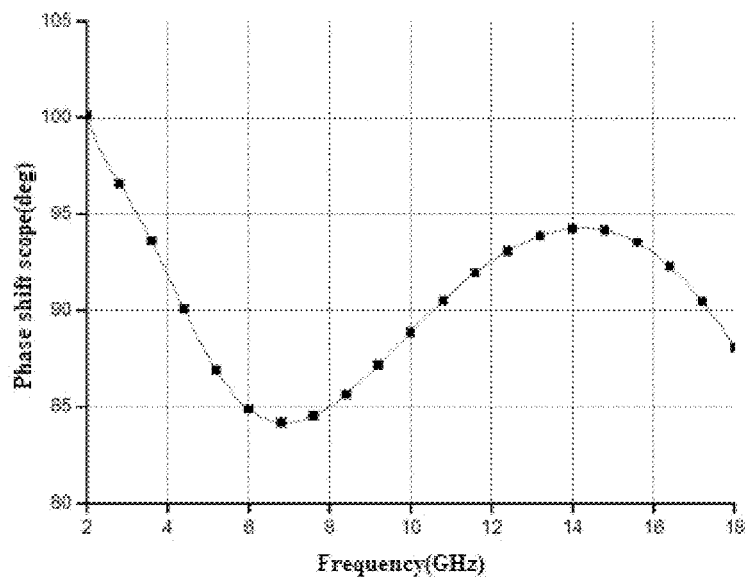
FIG. 9 is a diagram illustrating a simulation result of the 4~16 GHz ultra wide band 90-degree digital phase shifter in a phase shift scope.

Through electromagnetic simulation, the performances of the ultra wide band 90-degree digital phase shifter provided by the present invention within a 4~16 GHz working bandwidth required are as shown in FIGS. 6~9. As shown in FIG. 6, the input and output return losses under the reference state are greater than 14 dB. As shown in FIG. 7, the input and output return losses under the phase shift state are greater than 14 dB, which has excellent echoing characteristic, and is also beneficial for cascading multistage phase shifters. As shown in FIG. 8, the insertion losses of the two states are 4.6 dB±1.2 dB. As shown in FIG. 9, the phase shift scope is 90°±6°. It follows that the present disclosure has excellent phase shift stability within a quadruplicated frequency ultra wide band scope.

The above describes the preferred embodiments of the invention only, and it should be pointed out that the above embodiments are not intended to limit the invention. Various changes and modifications made by those skilled in the art without departing from the scope of the technical concept of the invention shall all fall within the protection scope of the invention.

The invention claimed is:

1. An ultra wide band digital phase shifter, comprising a coupler, a first impedance network and a second impedance network, wherein:
   the coupler is cascaded by spiral inductor coupling units; each stage of the spiral inductive coupling units includes a first spiral inductor and a second spiral inductor coupled mutually; multistage cascade of the spiral inductor coupling units is implemented through a series connection of each stage of the first spiral inductor and a series connection of each stage of the second spiral inductor;
   one end of the first spiral inductor in a first stage of the spiral inductor coupling units cascaded in the coupler is an input end of the coupler, and also serves as an input end of the phase shifter, and one end of a second spiral inductor in the first stage is a coupling end of the coupler connected with the first impedance network; one end of the first spiral inductor in a last stage of the spiral inductor coupling units in the coupler is a transmitted port of the coupler connected with the second impedance network, one end of a second spiral inductor in the last stage is an isolation end of the coupler, and also serves as an output end of the phase shifter; and
   a coupling interval or a microstrip band width of a microstrip of each spiral inductor coupling unit in the coupler from an exterior to an interior decreases gradually, wherein the exterior of the coupler is defined by spiral inductor coupling units adjacent to the input end of the coupler or the output end of the phase shifter.

2. The ultra wide band digital phase shifter according to claim 1, wherein the first impedance network and the second impedance network have the same structure; when a target phase shift is 180 degrees, each impedance network is a parallel structure end-connected with a corresponding connection end of the coupler, and one circuit in the parallel structure is connected with a first switch in series and grounded through the first inductor, and another circuit is connected with a second switch in series and grounded through a second capacitor.

3. The ultra wide band digital phase shifter according to claim 2, wherein working states of the first switch and the second switch in the first impedance network are the same, and the working states of the first switch and the second switch in the second impedance network are the same.

4. The ultra wide band digital phase shifter according to claim 1, wherein the first impedance network and the second impedance network have the same structure; when a target phase shift is non-180 degrees, each impedance network is second inductor end-connected with a corresponding connection end of the coupler and connected in series with a parallel structure, and one circuit in the parallel structure is connected with a first switch in series and grounded through a first inductor, and another circuit is connected with a second switch in series and grounded through a second capacitor.

5. The ultra wide band digital phase shifter according to claim 4, wherein working states of the first switch and the second switch in the first impedance network are contrary, and the working states of the first switch and the second switch in the second impedance network are contrary.

6. The ultra wide band digital phase shifter according to claim 1, wherein the spiral inductor coupling units are mutually coupled by locating the first spiral inductor and the second spiral inductor at the same layer of metal and using marginal coupling, or the spiral inductor coupling units are mutually coupled by locating the first spiral inductor and the second spiral inductor at different layers of metals and using marginal coupling and upper-lower layer coupling.

7. The ultra wide band digital phase shifter according to claim 1, wherein a bridging capacitor is bridged between ports of the first and second spiral inductors of each spiral inductor coupling unit located at the same side, and the two ends of the bridging capacitor are respectively grounded through a ground capacitor.

8. The ultra wide band digital phase shifter according to claim 1, wherein a circuit structure of the coupler is in bilateral symmetry and longitudinal symmetry.

9. The ultra wide band digital phase shifter according to claim 1, wherein all the elements in the phase shifter are lumped elements.

* * * * *